United States Patent
Lin et al.

(10) Patent No.: US 6,908,499 B2
(45) Date of Patent: Jun. 21, 2005

(54) COLD TRAP FOR CVD FURNACE

(75) Inventors: Leon Lin, Taoyuan (TW); Tom Fan, Hsinchu (TW); Steven Chen, Hsinchu (TW); Vito Lee, Hsinchu (TW); Yu-Hsiang Wu, Nantou (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 255 days.

(21) Appl. No.: 10/269,943

(22) Filed: Oct. 11, 2002

(65) Prior Publication Data

US 2004/0069224 A1 Apr. 15, 2004

(51) Int. Cl.[7] .................................................. B01D 8/00
(52) U.S. Cl. ........................ 95/290; 55/392.1; 55/434.2; 55/482.1; 55/DIG. 15
(58) Field of Search ............................... 55/315.2, 392, 55/392.1, 428.1, 434.2, 482.1, DIG. 15; 95/290; 438/680; 62/55.5; 118/715

(56) References Cited

U.S. PATENT DOCUMENTS

| | | | | |
|---|---|---|---|---|
| 5,820,641 A | * | 10/1998 | Gu et al. | 55/434.4 |
| 6,066,209 A | * | 5/2000 | Sajoto et al. | 118/715 |
| 6,107,198 A | * | 8/2000 | Lin et al. | 438/680 |
| 6,206,971 B1 | * | 3/2001 | Umotoy et al. | 118/715 |
| 6,286,321 B1 | * | 9/2001 | Glater | 62/55.5 |
| 6,319,299 B1 | * | 11/2001 | Shih et al. | 55/434.2 |
| 6,528,420 B1 | * | 3/2003 | Tong et al. | 438/680 |

FOREIGN PATENT DOCUMENTS

JP 02061067 A * 3/1990

* cited by examiner

Primary Examiner—Frank M. Lawrence
(74) Attorney, Agent, or Firm—Tung & Associates

(57) ABSTRACT

A cold trap having improved trapping efficiency for particles, particularly ammonium chloride fine powder particles. The cold trap has a dual-stage design, including an upstream stage fitted with at least one trap plate and a downstream stage fitted with a typically cup- or cone-shaped trap core in which is provided a conically-spiraled water cooling coil. A decreasing temperature gradient is provided along the length of the cold trap, such that exhaust gases flowing through the cold trap are gradually cooled and ammonium chloride or other particles which form from the gas are trapped by the trap plate or plates and collect in the trap core. The exhaust gases exiting the downstream end of the trap core are substantially or completely devoid of particles.

14 Claims, 2 Drawing Sheets

COLD TRAP FOR CVD FURNACE

FIELD OF THE INVENTION

The present invention relates to chemical vapor deposition (CVD) chambers used in the deposition of conductive and resistive layers on a semiconductor wafer substrate. More particularly, the present invention relates to a multi-stage cold trap for cooling exhaust gases from a CVD chamber and trapping particulate precipitates in the gas.

BACKGROUND OF THE INVENTION

In the semiconductor production industry, various processing steps are used to fabricate integrated circuits on a semiconductor wafer. These steps include the deposition of layers of different materials including metallization layers, passivation layers and insulation layers on the wafer substrate, as well as photoresist stripping and sidewall passivation polymer layer removal. In modern memory devices, for example, multiple layers of metal conductors are required for providing a multi-layer metal interconnection structure in defining a circuit on the wafer. Chemical vapor deposition (CVD) processes are widely used to form layers of materials on a semiconductor wafer.

Silicon nitride has been an important material in various semiconductor applications. For instance, silicon nitride has been used as a mask against oxygen diffusion during a local oxidation (LOCOS) process; as a passivation layer for its superior barrier property to contaminants; as a gate dielectric layer in memory devices; and as an interlevel dielectric layer in an oxide-nitride-oxide (ONO) stacked-gate structure. Silicon nitride also has superior barrier properties against metal ions and moisture.

Silicon nitride has been widely used as a passivation layer for protecting a semiconductor component. Silicon nitride can be formed by either a LPCVD or PECVD technique. The LPCVD technique, where dichlorosilane is used as the reactant gas, can be carried out in a hot-wall LPCVD system, such as in a vertical furnace. The chemical reaction can be described as follows:

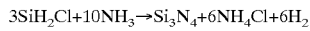

$$3SiH_2Cl_2+10NH_3 \rightarrow Si_3N_4+6NH_4Cl+6H_2$$

The hot-wall LPCVD system is normally carried out at a temperature between about 750°~800° C., and the chamber pressure is kept at several hundred m Torr. A layer of stoichiometric silicon nitride can thus be deposited on a wafer surface. A typical deposition equipment utilizing a vertical furnace is shown in FIG. 1.

During a vertical furnace silicon nitride process, as described by the above mechanism for the chemical reaction, a reaction by-product such as ammonium chloride ($NH_4Cl$) in the form of a fine powder can easily deposit on any cold surface in the furnace or in the ducting system for the furnace. The ammonium chloride powder must be captured by a cold trap such that it does not form on the inner walls of the ducting system or in the furnace and present a serious contamination source. For instance, fine powder in the ducts may be syphoned back into the furnace during a deposition process if the pressure in the furnace is not carefully controlled. The capture efficiency of the cold trap for the ammonium chloride fine powder is therefore an important factor in the successful deposition of silicon nitride films in a furnace technique.

As shown in FIG. 1, a vertical furnace unit 12 is the heart of a silicon nitride deposition system 10. During the deposition of a silicon nitride film on a plurality of wafers 16 positioned in the vertical furnace, the furnace exhaust gas 14, which contains unreacted reactant gases such as dichlorosilane, ammonium and reaction byproduct ammonium chloride powder, is drawn through a cold trap 22, via an exhaust conduit 20, by a vacuum pump 18 before the furnace exhaust gas enters into a gas treatment unit (not shown) and is released into a factory exhaust system (not shown). The capture of substantially all of the ammonium chloride fine powder in the cold trap 22 is therefore an important step in a successful exhaust gas treatment process for depositing silicon nitride.

A schematic view of a typical conventional cold trap 22 is shown in FIG. 2 and includes a bellow or pipe 24 which receives the exhaust gases from the exhaust conduit 20 of the system 10 shown in FIG. 1. A jacket heater 23 on the pipe 24 prevents the temperature of the exhaust gases flowing through the pipe 24 from dropping below a temperature of typically about 150° C. A trap housing 25 is provided in fluid communication with the outlet end of the pipe 24. The exhaust gases flow through a typically constant-diameter flow bore 26 extending through the trap housing 25, and a water cooling coil 27 winds through the flow bore 26. Cooling water is introduced into the water cooling coil 27 through a cooling water inlet 28, and is conducted from the water cooling coil 27 and the trap housing 25 through a cooling water outlet 29. Typically, the cooling water inlet 28 is located at the same vertical position as the cooling water outlet 29, as shown. Accordingly, as the exhaust gases flow through the flow bore 26, the exhaust gases contact the water cooling coil 27, which cools the exhaust gases. Ammonium chloride powder in the exhaust gases become trapped on the water cooling coil 27 and in the flow bore 26, such that the exhaust gases leave the bottom of the trap housing 25 substantially or completely devoid of the ammonium chloride.

One of the problems frequently associated with the conventional cold trap 22 is that the ammonium chloride powder accumulates in the flow bore 26 and on the water cooling coil 27 after a relatively short period of time of operation of the silicon nitride deposition system 10. This tends to restrict or completely block flow of the exhaust gases through the flow bore 26, and consequently increases loading on the vacuum pump 18. Consequently, damage to or failure of the vacuum pump 18 may result. Thus, the cold trap 22 must be subjected to preventative maintenance about every 4 months to remove the ammonium chloride powder from the trap housing 25. This results in unnecessary downtime in operation of the silicon nitride deposition system 10. Accordingly, a new and improved cold trap which is capable of operating for longer periods of time between periodic maintenance is needed.

Accordingly, an object of the present invention is to provide a new and improved cold trap that can be efficiently used in a semiconductor fabrication process for collecting unwanted particles and which does not have the drawbacks or shortcomings associated with conventional cold traps.

Another object of the present invention is to provide a cold trap that can be used effectively in a semiconductor material deposition system such that the cleaning frequency required for the cold trap can be reduced.

A further object of the present invention is to provide a cold trap for use in a semiconductor fabrication process and which does not require frequent cleaning.

Still another object of the present invention is to provide a new and improved cold trap which enhances operational efficiency and throughput of a semiconductor fabrication process.

Yet another object of the present invention is to provide a cold trap which may be provided with one or multiple trap plates for trapping particles.

Still another object of the present invention is to provide a cold trap which may be provided with a cone or cup shaped trap core which prevents premature particle blockage of the cold trap.

Yet another object of the present invention is to provide a cold trap which includes a first stage provided with one or multiple trap plates and a second stage which may be provided with a cup- or cone-shaped trap core for preventing premature particle blockage of the cold trap.

A still further object of the present invention is to provide a cold trap for use in a vertical furnace for depositing silicon nitride films wherein the trap has greatly improved efficiency for trapping ammonium chloride fine powder.

Another object of the present invention is to provide a cold trap which is particularly suitable for trapping ammonium chloride or other particles in a semiconductor fabrication process but which may be equally adapted to a variety of other industrial applications.

SUMMARY OF THE INVENTION

In accordance with these and other objects and advantages, the present invention is generally directed to a cold trap having improved trapping efficiency for particles, particularly ammonium chloride fine powder particles. The cold trap has a dual-stage design, including an upstream stage fitted with at least one trap plate and a downstream stage fitted with a typically cup- or cone-shaped trap core in which is provided a conically-spiraled water cooling coil. A decreasing temperature gradient is provided along the length of the cold trap, such that exhaust gases flowing through the cold trap are gradually cooled and ammonium chloride or other particles which form from the gas are trapped by the trap plate or plates and collect in the trap core. The exhaust gases exiting the downstream end of the trap core are substantially or completely devoid of particles. The trap plate or plates in the upstream stage, alone or in combination with the cone-shaped trap core in the downstream stage, facilitate effective removal of particles from the flowing gas while preventing premature clogging of the trap with particles which otherwise requires frequent cleaning of the trap.

The cold trap may include a bellow or pipe on which is fitted a primary jacket heater. A trap plate housing, which forms the upstream stage of the cold trap and contains the trap plate or plates, is fitted with a tertiary jacket heater. A secondary jacket heater is fitted typically on a connector which connects the pipe to the trap plate housing. A cooling housing, which forms the downstream stage of the cold trap and contains the typically cone-shaped trap core and spiraled cooling coil, is connected to the downstream end of the trap plate housing. A connector provided on the cooling housing connects the cooling housing to the trap plate housing, and is typically fitted with a quaternary jacket heater.

As the exhaust gases flow downstream through pipe or bellows of the cold trap, the primary jacket heater on the pipe or bellows prevents the temperature of the gases from dropping beneath typically about 150° C. The secondary jacket heater on the connector between the pipe or bellows and the trap plate housing maintains the temperature of the gases at or above about 120° C. The tertiary jacket heater on the trap plate housing maintains the temperature of the gases at or above about 80° C. The quaternary jacket heater on the connector between the trap plate housing and the cooling housing maintains the temperature of the gases at or above about 30° C. Finally, the water or other cooling fluid flowing through the cooling coil in the cooling housing cools the exhaust gas to room temperature, or about 25° C.

The gradual cooling of the exhaust gases as they traverse the cold trap facilitates a gradual, thermally-induced deposit of ammonium chloride particles first on the trap plate or plates in the trap plate housing of the upstream stage, and then on the cooling coil and interior walls of the typically cone-shaped trap core in the cooling housing of the downstream stage, of the cold trap. Accordingly, the gradual, rather than sudden, cooling of the exhaust gases among two stages, rather than one stage, of the cold trap prevents deposit of an excessive quantity of the ammonium chloride particles in one portion of the trap which would otherwise cause premature clogging of the trap and frequent trap cleanings.

BRIEF DESCRIPTION OF THE DRAWINGS

The invention will be better understood, by way of example, with reference to the accompanying drawings, in which.

DESCRIPTION OF THE PREFERRED EMBODIMENTS

The present invention discloses a cold trap for use in a semiconductor film deposition system for collecting reaction byproducts in an exhaust gas from a deposition furnace. The present invention cold trap can be used in any furnace exhaust system, but is particularly suitable for use in a silicon nitride furnace deposition system wherein the exhaust gas contains ammonium chloride fine powder that should be collected by an efficient cold trap device.

Figure 1:
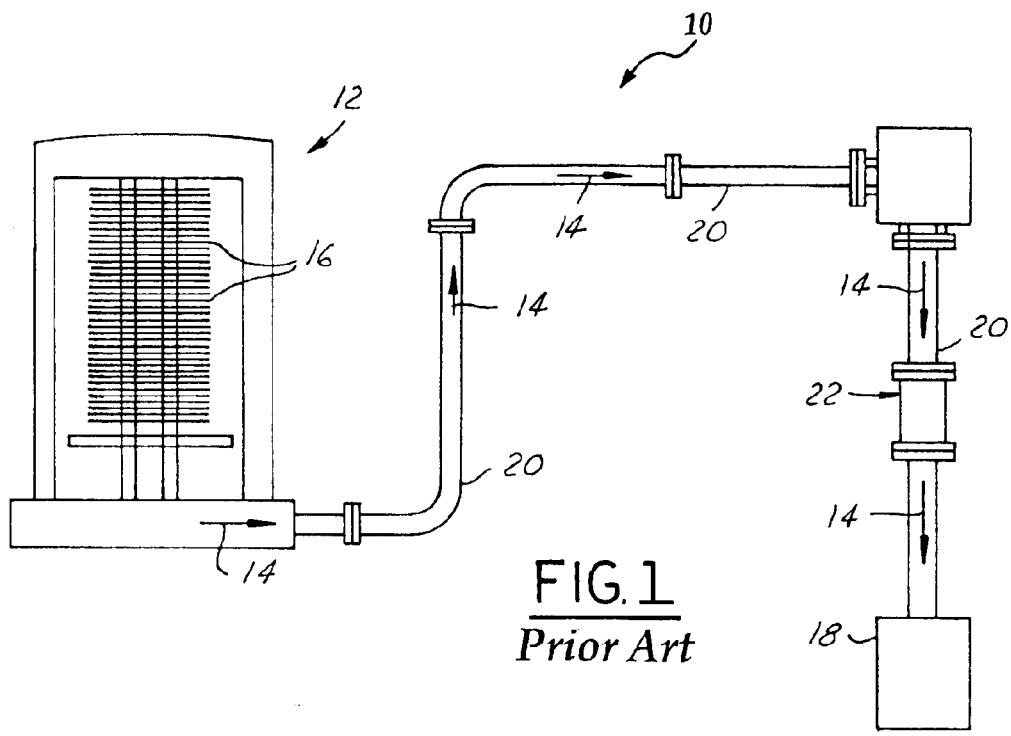
FIG. 1 is a schematic view of a typical conventional furnace deposition system equipped with a furnace unit, a cold trap and a vacuum pump.
Figure 2:
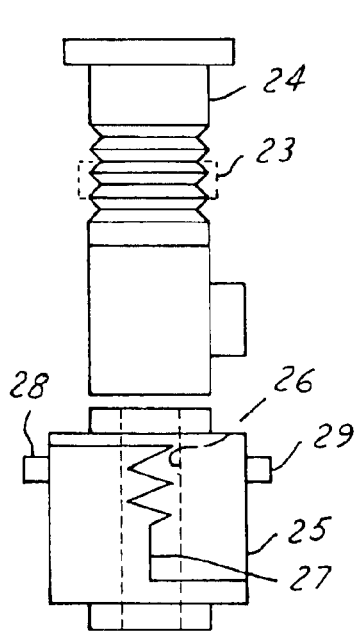
FIG. 2 is a side view of a typical conventional cold trap.
Figure 3:
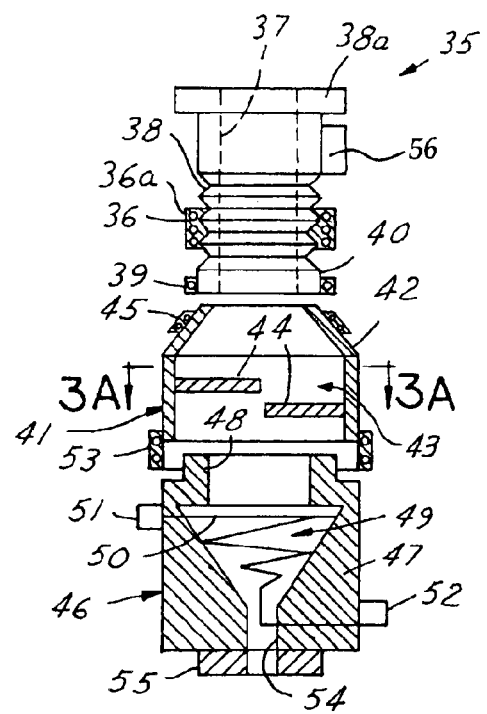
FIG. 3 is an exploded view, partially in cross-section, of a cold trap in accordance with the present invention.
Figure 3A:
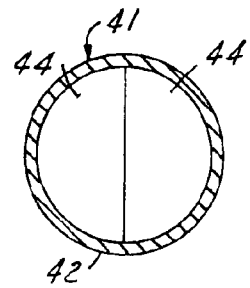
FIG. 3A is a cross-sectional view, taken along section lines 3A—3A in FIG. 3.
Figure 3B:
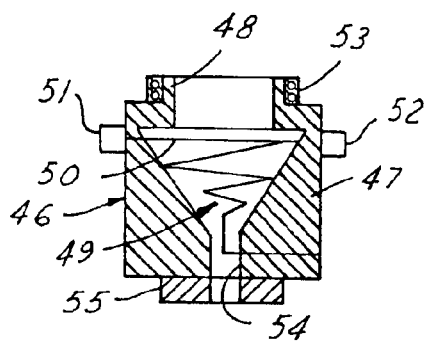
FIG. 3B is a sectional view illustrating an alternative configuration for the cooling housing element of the present invention.

Referring to FIGS. 3–3B, an illustrative embodiment of the cold trap of the present invention is generally indicated by reference numeral 35 and typically includes a bellow or pipe 38, the upstream inlet end of which may be provided with a pipe flange 38a to facilitate confluent attachment of the cold trap 35 to an exhaust conduit such as the exhaust conduit 20 heretofore described with respect to the silicon nitride deposition system 10 of FIG. 1. A pipe clamp 56 may be provided on the pipe 38 for removable attachment of the pipe 38 to the exhaust conduit. A pipe bore 37 extends through the pipe 38. A trap plate housing 41, which may have a tapered body 42 that defines a housing interior 43, is provided in fluid communication with the pipe 38. Accordingly, the downstream outlet end of the pipe 38 may be fitted with a threaded connector 40 to facilitate confluent attachment of the upstream inlet end of the trap plate housing 41 to the pipe 38. As shown in FIGS. 3 and 3A, at least one, and preferably, a pair of trap plates 44 extends from the interior surface of the body 42 and into the housing interior 43. Each of the trap plates 44 typically has a substantially semicircular shape, as shown in FIG. 3A, and may be characterized by a screen or mesh, or may have any other alternative construction which is suitable for trapping fine particles therein, as hereinafter described. As shown in FIG. 3, the trap plates 44 typically extend from opposite sides of the body 42, and may be disposed in vertically-offset or staggered relationship with respect to each other.

A cooling housing 46 is provided in fluid communication with the trap plate housing 41. Accordingly, the upstream inlet end of the cooling housing 46 typically includes a connector 48 which may threadably or otherwise sealingly engage the outlet end of the trap plate housing 41. The cooling housing 46 includes a cooling housing wall 47 in which is provided a trap core 49 that is disposed in fluid communication with the housing interior 43 of the trap plate housing 41. As shown in FIG. 3, the trap core 49 typically has an inverted cone shape, the wide end of which trap core 49 is disposed at or adjacent to the upstream or inlet end of the cooling housing 46 and the narrow end of which trap core 49 is disposed at the downstream or outlet end of the cooling housing 46. A cooling coil 50 enters the cooling housing 46 at a cooling coil inlet 51 and winds in a conical spiral configuration from the wide end of the cone-shaped trap core 49 to the narrow end of the trap core 49. The cooling coil 50 exits the cooling housing 46 at a cooling coil outlet 52, which may be disposed in offset relationship with respect to the cooling coil inlet 51 on the cooling housing 46, as shown in FIG. 3. Alternatively, as shown in FIG. 3B, the cooling coil outlet 52 may be disposed at the same level on the cooling housing 46 as the cooling coil inlet 51. An outlet bore 54 extends from the narrow end of the trap core 49 and typically through a connector 55 which facilitates confluent attachment of the cold trap 35 to the remaining segment of the exhaust conduit, such as the exhaust conduit 20 heretofore described with respect to FIG. 1.

As further shown in FIG. 3, in typical application of the cold trap 35 as hereinafter described, a primary jacket heater 36, which may be conventional and typically includes heating coils 36a, is typically fitted on the pipe 38. A secondary jacket heater 39 is fitted on the pipe 38, typically on the connector 40 thereof. A tertiary jacket heater 45 is fitted on the body 42 of the trap plate housing 41, and a quaternary jacket heater 53 is fitted on the cold trap 35, typically at the junction of the trap plate housing 41 with the cooling housing 46.

As hereinafter further described, the primary jacket heater 36, the secondary jacket heater 39, the tertiary jacket heater 45, the quaternary jacket heater 53 and the water cooling coil 50 impart a decreasing temperature gradient to the cold trap 35 as exhaust gases flow through the pipe 38, the trap plate housing 41 and the cooling housing 46, respectively. The primary jacket heater 36 heats the pipe 38 to a temperature of typically about 150° C.; the secondary jacket heater 39 heats the connector 40 of the pipe 38 to a temperature of typically about 120° C.; the tertiary jacket heater 45 heats the body 42 of the trap plate housing 41 to a temperature of typically about 80° C.; and the quaternary jacket heater 53 heats the junction of the trap plate housing 41 and the cooling housing 46 to a temperature of typically about 30° C. The cooling water or other liquid or fluid flowing through the cooling coil 50 in the trap core 49 of the cooling housing 46 cools the exhaust gas to a temperature of typically about 25° C., or room 5 temperature. The resulting decreasing temperature gradient along the length of the cold trap 35 facilitates controlled deposit of ammonium chloride particles from the gas onto the interior surfaces of the trap plate housing 41 and the cooling housing 46, thereby preventing excessive deposit of the ammonium chloride particles in the cooling housing 46, and thus, premature blockage of the cooling housing 46 during operation of the silicon nitride deposition system.

Figure 4:
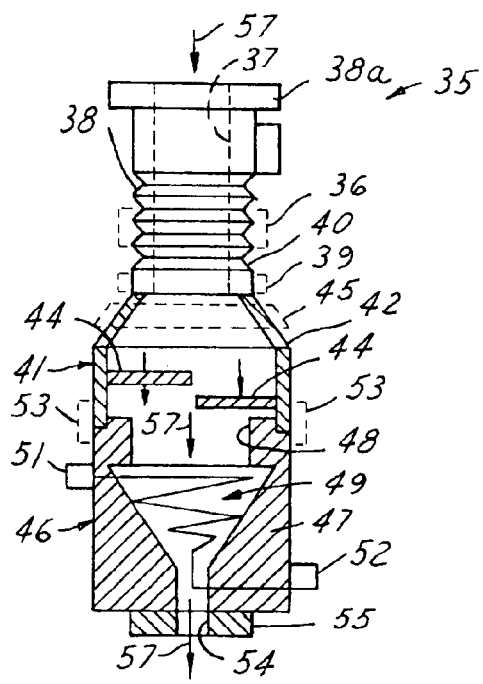
FIG. 4 is a partially schematic view of the cold trap of FIG. 3, in implementation of the present invention.

Referring next to FIG. 4, in typical application the cold trap 35 of the present invention is mounted in an exhaust conduit such as the exhaust conduit 20 of the silicon nitride deposition system 10 heretofore described with respect to FIG. 1. Accordingly, the pipe flange 38a of the pipe 38 is attached to one segment of the exhaust conduit, and the connector 55 of the cooling housing 46 is connected to another segment of the exhaust conduit. However, it is understood that the cold trap 35 may be mounted in fluid communication with the exhaust conduit according to any of a variety of methods known by those skilled in the art.

During operation of the silicon nitride deposition system, the trap plate housing 41 of the cold trap 35 functions as a first stage particle trap, and the cooling housing 46 of the cold trap 35 functions as a second stage particle trap. A stream of furnace exhaust gas 57, which contains unreacted reactant gases such as dichlorosilane, ammonium and reaction byproduct ammonium chloride powder, is drawn through the cold trap 35, via the exhaust conduit. The exhaust gas 57 cools as it flows through the exhaust conduit, and continues to gradually cool as it flows through the pipe bore 37 of the pipe 38. However, it is necessary to maintain the temperature of the interior surfaces of the pipe 38 at an elevated level, preferably about 150° C., to prevent premature deposit and excessive accumulation of the ammonium chloride particles on those surfaces as the exhaust gas 57 flows through the pipe 38. Accordingly, the primary jacket heater 36 heats the pipe 38 to a temperature of typically about 150° C., and this relatively high temperature of the pipe 38 prevents premature deposit and accumulation of the ammonium chloride particles on the interior surfaces of the pipe 38. The secondary jacket heater 39 maintains the temperature of the connector 40 at a temperature of at least about 120° C., and the tertiary jacket heater 45 maintains the temperature of the interior surfaces of the body 42 and the trap plates 44 of the trap plate housing 41 at a temperature of at least about 80° C. As the exhaust gas flows from the pipe 38 into the trap plate housing 41 and through the trap plates 44, ammonium chloride particles collect primarily on the trap plates 44. Accordingly, the trap plates 44 filter the exhaust gas and remove many of the ammonium chloride particles therefrom as the ammonium chloride particles accumulate on the trap plates 44. As it then flows from the trap plate housing 41 and into the trap core 49 of the cooling housing 46, the exhaust gas further cools to a temperature not exceeding typically about 30° C., since the quaternary jacket heater 53 maintains the connector 48 of the cooling housing 46 at a temperature of no less than 30° C., to prevent excessive deposit of the ammonium chloride particles on the interior surfaces of the connector 48. Finally, the cooling coil 50, at a temperature of typically about 25° C., provides a sufficiently cool surface to facilitate deposit of a relatively large quantity of ammonium chloride particles on the cooling coil 50 and the cone-shaped interior surfaces of the cooling housing wall 47 in the trap core 49. Finally, the exhaust gas, substantially devoid of ammonium chloride particles, exits the trap core 49 and the cooling housing 46 through the outlet bore 54.

Figure 5:
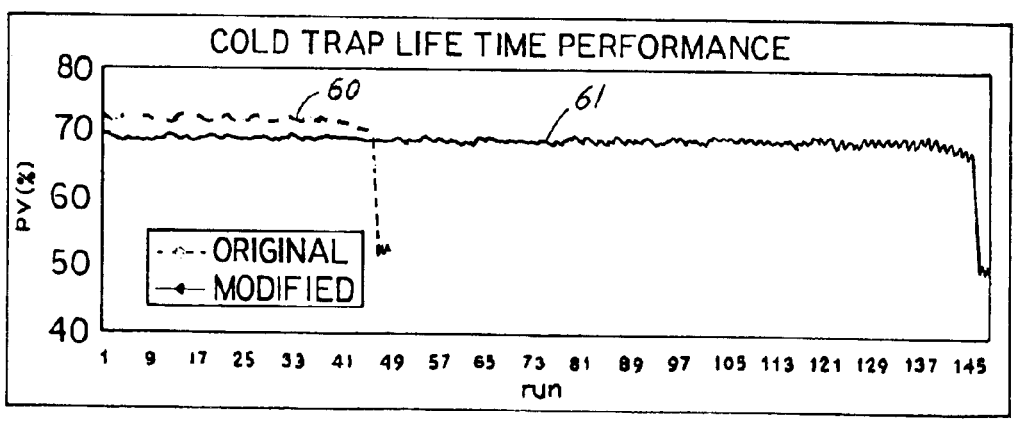
FIG. 5 is a graph illustrating long-term performance of the cold trap of the present invention as compared to the long-term performance of a conventional cold trap.

Referring next to FIG. 5, it will be appreciated by those skilled in the art that the cold trap of the present invention is capable of substantially increasing the time required between successive periodic maintenance (PM) of the cold trap for the removal of ammonium chloride particles therefrom, as compared to the time required between PM cleanings of conventional cold traps. As can be seen from the graph, the conventional cold trap, indicated by the numeral 60, becomes clogged with ammonium chloride particles and thus, requires a periodic maintenance cleaning, after about 48 runs of operation. In contrast, the cold trap of the present invention, indicated by reference numeral 61, requires a periodic maintenance cleaning after about 144 runs of operation. Referring again to FIG. 4, due to the cone-shaped configuration of the trap core 49, the ammonium chloride particles are capable of forming a layer of up to about 21 μm on the interior surfaces of the cooling housing wall 47 before PM cleaning is required, necessitating PM cleanings about every eight months. In contrast, PM cleanings of the conventional cold trap are required after the ammonium chloride particles form a layer of about 7 μm, necessitating PM chamber cleanings about every eight months.

While the preferred embodiments of the invention have been described above, it will be recognized and understood that various modifications can be made in the invention and the appended claims are intended to cover all such modifications which may fall within the spirit and scope of the invention.

What is claimed is:

1. A cold trap for removing particles from a gas, comprising:
   a first stage trap for receiving the gas and removing a first quantity of the particles from the gas; and
   a second stage trap provided in fluid communication with said first stage trap for receiving the gas from said first stage trap and removing a second quantity of the particles from the gas; and
   wherein said second stage trap comprises a generally conical trap core and a conically spiraled cooling coil provided in said trap core for removing said second quantity of the particles from the gas.

2. The cold trap of claim 1 wherein said first stage trap comprises a trap plate housing and at least one trap plate provided in said trap plate housing for removing said first quantity of the particles from the gas.

3. The cold trap of claim 1 further comprising at least one jacket heater provided on said first stage trap.

4. The cold trap of claim 3 wherein said first stage trap comprises a trap plate housing and at least one trap plate provided in said trap plate housing for removing said first quantity of the particles from the gas.

5. A cold trap for removing particles from a gas, comprising:
   a pipe for receiving the gas;
   a primary jacket heater provided on said pipe;
   a trap plate housing provided in fluid communication with said pipe at a first junction for receiving the gas from said pipe;
   a secondary jacket heater provided at said first junction;
   at least one trap plate provided in said trap plate housing for removing a first quantity of the particles from the gas; and
   a cooling housing provided in fluid communication with said trap plate housing at a second junction for receiving the gas from said trap plate housing and removing a second quantity of the particles from the gas.

6. The cold trap of claim 5 further comprising a tertiary jacket heater provided on said trap plate housing.

7. The cold trap of claim 6 further comprising a quaternary jacket heater provided at said second junction.

8. The cold trap of claim 7 wherein said cooling housing further comprises a generally conical trap core and a conically spiraled cooling coil provided in said trap core for removing said second quantity of the particles from the gas.

9. A method of removing particles from a gas, comprising the steps of:
   providing a first stage trap;
   providing a decreasing temperature gradient in said first stage trap along a direction of flow of the gas through said first stage trap by providing at least one heating jacket on said first stage trap;
   providing a second stage trap in fluid communication with said first stage trap;
   wherein said second stage trap comprises a cooling housing provided in fluid communication with said first stage trap, a generally conical trap core provided in said cooling housing and a conically-spiraled cooling coil provided in said trap core;
   flowing a cooling fluid through said cooling coil;
   distributing the gas through said first stage trap and said second stage trap, respectively;
   removing a first quantity of the particles from the gas in said first stage trap; and
   removing a second quantity of the particles from the gas in said second stage trap.

10. The method of claim 9 wherein said first stage trap comprises a pipe and a trap plate housing comprising at least one trap plate provided in fluid communication with said pipe at a junction and further comprising the step of heating said pipe to a temperature of about 150° C.

11. The method of claim 10 further comprising the step of heating said junction to a temperature of about 120° C.

12. The method of claim 11 further comprising the step of heating said trap plate housing to a temperature of about 80° C.

13. The method of claim 12 wherein said second stage trap comprises a cooling housing provided in fluid communication with said trap plate housing at a second junction and further comprising the step of heating said second junction to a temperature of about 30° C.

14. The method of claim 13 further comprising a generally conical trap core provided in said cooling housing and a conically-spiraled cooling coil provided in said trap core, and further comprising the step of cooling said cooling coil to a temperature of about 25° C. by flowing a cooling fluid through said cooling coil.

* * * * *